US012652007B2

(12) United States Patent
Khlat

(10) Patent No.: US 12,652,007 B2
(45) Date of Patent: Jun. 9, 2026

(54) MULTI-VOLTAGE GENERATION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 854 days.

(21) Appl. No.: 17/946,224

(22) Filed: Sep. 16, 2022

(65) Prior Publication Data

US 2023/0124941 A1 Apr. 20, 2023

Related U.S. Application Data

(60) Provisional application No. 63/255,649, filed on Oct. 14, 2021, provisional application No. 63/255,651, filed on Oct. 14, 2021.

(51) Int. Cl.
H03F 3/02 (2006.01)
G05F 1/56 (2006.01)
H03F 3/24 (2006.01)

(52) U.S. Cl.
CPC ............... H03F 3/245 (2013.01); G05F 1/56 (2013.01); *H03F 2200/129* (2013.01); *H03F 2200/451* (2013.01)

(58) Field of Classification Search
CPC ............... H03F 3/245; H03F 2200/129; H03F 2200/451; H03F 2200/48;
(Continued)

(56) References Cited

U.S. PATENT DOCUMENTS 5,982,233 A 11/1999 Hellmark et al.
7,859,338 B2 12/2010 Bajdechi et al.
(Continued)

FOREIGN PATENT DOCUMENTS

DE 102019218816 A1 6/2020
EP 2254237 A2 11/2010
(Continued)

OTHER PUBLICATIONS

International Preliminary Report on Patentability for International Patent Application No. PCT/US2021/061721, mailed Apr. 4, 2023, 21 pages.
(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A multi-voltage power generation circuit is disclosed. More specifically, the multi-voltage generation circuit includes multiple voltage modulation circuits that are configured to generate and maintain multiple modulated voltages. In a non-limiting example, the multiple modulated voltages can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

20 Claims, 6 Drawing Sheets

(58) Field of Classification Search
CPC . H03F 2203/45626; H03F 2203/45628; H03F
2203/45631; H03F 2203/45646; H03F
3/195; H03F 3/213; H03F 3/24; H03F
3/45475; H03F 1/0216; G05F 1/56
USPC ........................................................ 330/291
See application file for complete search history.

(56) References Cited

U.S. PATENT DOCUMENTS

| | | | |
|---|---|---|---|
| 8,159,309 B1 | 4/2012 | Khlat et al. | |
| 8,718,188 B2 | 5/2014 | Balteanu et al. | |
| 8,912,769 B2 | 12/2014 | Lin et al. | |
| 9,020,453 B2 | 4/2015 | Briffa et al. | |
| 9,069,365 B2 | 6/2015 | Brown et al. | |
| 9,148,090 B2 | 9/2015 | Tsuji | |
| 9,172,331 B2 | 10/2015 | Nagasaku et al. | |
| 9,231,527 B2 | 1/2016 | Hur et al. | |
| 9,252,724 B2 | 2/2016 | Wimpenny | |
| 9,350,299 B2 | 5/2016 | Tsuj | |
| 9,356,512 B2 | 5/2016 | Chowdhury et al. | |
| 9,356,760 B2 | 5/2016 | Larsson et al. | |
| 9,391,567 B2 | 7/2016 | Kacman | |
| 9,407,476 B2 | 8/2016 | Lim et al. | |
| 9,496,828 B2 | 11/2016 | Ye | |
| 9,560,595 B2 | 1/2017 | Dakshinamurthy et al. | |
| 9,590,563 B2 | 3/2017 | Wimpenny | |
| 9,614,477 B1 | 4/2017 | Rozenblit et al. | |
| 9,634,560 B2 | 4/2017 | Ek | |
| 9,755,677 B2 | 9/2017 | Talty et al. | |
| 9,991,913 B1 | 6/2018 | Dinur et al. | |
| 10,097,145 B1 | 10/2018 | Khlat et al. | |
| 10,103,926 B1 | 10/2018 | Khlat | |
| 10,142,074 B2 | 11/2018 | Wang et al. | |
| 10,243,524 B2 | 3/2019 | Orr | |
| 10,326,408 B2 | 6/2019 | Khlat et al. | |
| 10,476,437 B2 | 11/2019 | Nag et al. | |
| 10,778,094 B2 | 9/2020 | de Cremoux | |
| 10,862,428 B2 | 12/2020 | Henzler et al. | |
| 10,998,859 B2 | 5/2021 | Khlat | |
| 11,018,627 B2 | 5/2021 | Khlat | |
| 11,018,638 B2 | 5/2021 | Khlat et al. | |
| 11,088,660 B2 | 8/2021 | Lin et al. | |
| 11,223,323 B2 | 1/2022 | Drogi et al. | |
| 11,223,325 B2 | 1/2022 | Drogi et al. | |
| 11,349,513 B2 | 5/2022 | Stockert et al. | |
| 11,489,695 B2 | 11/2022 | Ngo et al. | |
| 11,539,330 B2 | 12/2022 | Khlat | |
| 11,558,016 B2 * | 1/2023 | Khlat ...................... H03F 3/245 | |
| 11,569,783 B2 | 1/2023 | Nomiyama et al. | |
| 11,588,449 B2 | 2/2023 | Khlat et al. | |
| 11,665,654 B2 | 5/2023 | Park et al. | |
| 11,716,057 B2 | 8/2023 | Khlat | |
| 11,728,774 B2 | 8/2023 | Khlat | |
| 11,757,414 B2 | 9/2023 | Drogi et al. | |
| 11,894,767 B2 | 2/2024 | Khlat et al. | |
| 11,909,385 B2 | 2/2024 | Khlat | |
| 11,973,469 B2 | 4/2024 | Retz et al. | |
| 11,984,853 B2 | 5/2024 | Khlat | |
| 11,984,854 B2 | 5/2024 | Khlat et al. | |
| 12,063,018 B2 | 8/2024 | Khlat | |
| 2003/0099230 A1 | 5/2003 | Wenk | |
| 2004/0179382 A1 | 9/2004 | Thaker et al. | |
| 2011/0109393 A1 | 5/2011 | Adamski et al. | |
| 2012/0068767 A1 | 3/2012 | Henshaw et al. | |
| 2013/0141063 A1 | 6/2013 | Kay et al. | |
| 2013/0141068 A1 | 6/2013 | Kay et al. | |
| 2014/0055197 A1 | 2/2014 | Khlat et al. | |
| 2014/0097895 A1 | 4/2014 | Khlat et al. | |
| 2014/0232458 A1 | 8/2014 | Arno et al. | |
| 2014/0312710 A1 | 10/2014 | Li | |
| 2014/0315504 A1 | 10/2014 | Sakai et al. | |
| 2014/0361837 A1 | 12/2014 | Strange et al. | |
| 2015/0270806 A1 | 9/2015 | Wagh et al. | |
| 2016/0094192 A1 | 3/2016 | Khesbak et al. | |
| 2016/0241208 A1 | 8/2016 | Lehtola | |

| | | | |
|---|---|---|---|
| 2016/0294587 A1 | 10/2016 | Jiang et al. | |
| 2017/0331433 A1 | 11/2017 | Khlat | |
| 2017/0373644 A1 | 12/2017 | Gatard et al. | |
| 2018/0092047 A1 | 3/2018 | Merlin | |
| 2018/0234011 A1 | 8/2018 | Muramatsu et al. | |
| 2018/0257496 A1 | 9/2018 | Andoh et al. | |
| 2018/0278213 A1 | 9/2018 | Henzler et al. | |
| 2018/0351454 A1 | 12/2018 | Khesbak et al. | |
| 2019/0068234 A1 | 2/2019 | Khlat et al. | |
| 2019/0109566 A1 | 4/2019 | Folkmann et al. | |
| 2019/0181813 A1 | 6/2019 | Maxim et al. | |
| 2019/0222175 A1 | 7/2019 | Khlat et al. | |
| 2019/0288645 A1 | 9/2019 | Nag et al. | |
| 2019/0334750 A1 | 10/2019 | Nomiyama et al. | |
| 2019/0356285 A1 | 11/2019 | Khlat et al. | |
| 2020/0076297 A1 | 3/2020 | Nag et al. | |
| 2020/0127612 A1 | 4/2020 | Khlat et al. | |
| 2020/0136575 A1 | 4/2020 | Khlat et al. | |
| 2020/0204422 A1 | 6/2020 | Khlat | |
| 2020/0212796 A1 | 7/2020 | Murphy et al. | |
| 2020/0228063 A1 * | 7/2020 | Khlat ..................... H03F 1/0227 |
| 2020/0266766 A1 | 8/2020 | Khlat et al. | |
| 2020/0295708 A1 | 9/2020 | Khlat | |
| 2020/0321917 A1 | 10/2020 | Nomiyama et al. | |
| 2020/0336105 A1 | 10/2020 | Khlat | |
| 2020/0336111 A1 | 10/2020 | Khlat | |
| 2020/0350865 A1 | 11/2020 | Khlat | |
| 2020/0382061 A1 * | 12/2020 | Khlat ...................... H04B 1/16 |
| 2020/0382062 A1 | 12/2020 | Khlat | |
| 2020/0389132 A1 | 12/2020 | Khlat et al. | |
| 2021/0036604 A1 | 2/2021 | Khlat et al. | |
| 2021/0099137 A1 | 4/2021 | Drogi et al. | |
| 2021/0126599 A1 | 4/2021 | Khlat et al. | |
| 2021/0175798 A1 | 6/2021 | Liang | |
| 2021/0184708 A1 | 6/2021 | Khlat | |
| 2021/0194517 A1 | 6/2021 | Mirea et al. | |
| 2021/0218374 A1 | 7/2021 | Poulin | |
| 2021/0226585 A1 | 7/2021 | Khlat | |
| 2021/0257971 A1 | 8/2021 | Kim et al. | |
| 2021/0265953 A1 | 8/2021 | Khlat | |
| 2021/0288615 A1 * | 9/2021 | Khlat ...................... H03F 3/245 |
| 2021/0389789 A1 | 12/2021 | Khlat et al. | |
| 2021/0391833 A1 | 12/2021 | Khlat et al. | |
| 2022/0021302 A1 | 1/2022 | Khlat et al. | |
| 2022/0029614 A1 | 1/2022 | Khlat | |
| 2022/0037982 A1 | 2/2022 | Khlat et al. | |
| 2022/0052655 A1 | 2/2022 | Khalt | |
| 2022/0057820 A1 | 2/2022 | Khlat et al. | |
| 2022/0066487 A1 | 3/2022 | Khlat | |
| 2022/0069788 A1 | 3/2022 | King et al. | |
| 2022/0123744 A1 | 4/2022 | Khlat | |
| 2022/0200447 A1 | 6/2022 | Khlat | |
| 2022/0224364 A1 | 7/2022 | Kim et al. | |
| 2022/0271714 A1 | 8/2022 | Khlat | |
| 2022/0294486 A1 | 9/2022 | Cao et al. | |
| 2022/0407465 A1 | 12/2022 | Khlat | |
| 2023/0081095 A1 | 3/2023 | Khlat | |
| 2023/0085587 A1 | 3/2023 | Shute | |
| 2023/0118768 A1 | 4/2023 | Khlat | |
| 2023/0119987 A1 | 4/2023 | Khlat | |
| 2023/0124652 A1 | 4/2023 | Khlat et al. | |
| 2024/0036632 A1 * | 2/2024 | Khlat ........................ H03F 3/19 |
| 2024/0172131 A1 | 5/2024 | Ballantyne et al. | |
| 2024/0223129 A1 | 7/2024 | Retz et al. | |
| 2025/0023463 A1 * | 1/2025 | Khlat ..................... H03F 3/195 |

FOREIGN PATENT DOCUMENTS

| | | |
|---|---|---|
| WO | 2018187245 A1 | 10/2018 |
| WO | 2021016350 A1 | 1/2021 |

OTHER PUBLICATIONS

U.S. Appl. No. 17/942,472, filed Sep. 12, 2022.
U.S. Appl. No. 17/946,170, filed Sep. 16, 2022.
U.S. Appl. No. 17/946,470, filed Sep. 16, 2022.
U.S. Appl. No. 17/947,567, filed Sep. 19, 2022.

(56) References Cited

OTHER PUBLICATIONS

Non-Final Office Action for U.S. Appl. No. 17/217,654, mailed Jul. 1, 2022, 9 pages.

Non-Final Office Action for U.S. Appl. No. 17/218,904, mailed May 25, 2022, 14 pages.

Notice of Allowance for U.S. Appl. No. 17/315,652, mailed Jun. 20, 2022, 8 pages.

Mellon, L., "Data Transmission—Parallel vs Serial," Jul. 10, 2017, https://www.quantil.com/content-delivery-insights/content-acceleration/data-transmission/, 4 pages.

International Search Report and Written Opinion for International Patent Application No. PCT/US2021/044596, mailed Apr. 21, 2022, 13 pages.

Written Opinion for International Patent Application No. PCT/US2021/044596, mailed Jun. 10, 2022, 6 pages.

International Preliminary Report on Patentability for International Patent Application No. PCT/US2021/044596, mailed Sep. 1, 2022, 19 pages.

Notice of Allowance for U.S. Appl. No. 17/182,539, mailed Sep. 14, 2022, 7 pages.

Notice of Allowance for U.S. Appl. No. 17/217,654, mailed Oct. 12, 2022, 8 pages.

Non-Final Office Action for U.S. Appl. No. 17/237,244, mailed Sep. 20, 2021, 14 pages.

Notice of Allowance for U.S. Appl. No. 17/237,244, mailed Jan. 27, 2022, 8 pages.

Notice of Allowance for U.S. Appl. No. 17/218,904, mailed Aug. 26, 2022, 9 pages.

Non-Final Office Action for U.S. Appl. No. 17/325,482, mailed Sep. 30, 2021, 10 pages.

Non-Final Office Action for U.S. Appl. No. 17/325,482, mailed Mar. 15, 2022, 10 pages.

Final Office Action for U.S. Appl. No. 17/325,482, mailed Aug. 16, 2022, 12 pages.

Advisory Action for U.S. Appl. No. 17/325,482, mailed Oct. 14, 2022, 3 pages.

Non-Final Office Action for U.S. Appl. No. 17/315,652, mailed Sep. 2, 2021, 7 pages.

Non-Final Office Action for U.S. Appl. No. 17/315,652, mailed Feb. 14, 2022, 12 pages.

Non-Final Office Action for U.S. Appl. No. 17/408,899, mailed Aug. 29, 2022, 13 pages.

International Search Report and Written Opinion for International Patent Application No. PCT/US2021/061721, mailed Mar. 14, 2022, 13 pages.

Written Opinion for International Patent Application No. PCT/US2021/061721, mailed Sep. 9, 2022, 7 pages.

Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.

Notice of Allowance for U.S. Appl. No. 17/217,594, mailed Apr. 3, 2023, 7 pages.

Notice of Allowance for U.S. Appl. No. 17/408,899, mailed Feb. 24, 2023, 9 pages.

Non-Final Office Action for U.S. Appl. No. 17/942,472, mailed Feb. 16, 2023, 13 pages.

Extended European Search Report for European Patent Application No. 22195683.2, mailed Feb. 10, 2023, 12 pages.

Written Opinion for International Patent Application No. PCT/US2021/061721, mailed Mar. 1, 2023, 7 pages.

Extended European Search Report for European Patent Application No. 22200302.2, mailed Mar. 1, 2023, 14 pages.

Extended European Search Report for European Patent Application No. 22200322.0, mailed Mar. 1, 2023, 13 pages.

Extended European Search Report for European Patent Application No. 22200300.6, mailed Feb. 24, 2023, 10 pages.

Extended European Search Report for European Patent Application No. 22200111.7, mailed Feb. 20, 2023, 9 pages.

Notice of Allowance for U.S. Appl. No. 17/316,828, mailed Sep. 13, 2023, 8 pages.

Final Office Action for U.S. Appl. No. 17/942,472, mailed Jul. 19, 2023, 15 pages.

Advisory Action Action for U.S. Appl. No. 17/942,472, mailed Sep. 15, 2023, 3 pages.

Non-Final Office Action for U.S. Appl. No. 18/203,197, mailed Sep. 16, 2024, 6 pages.

Notice of Allowance for U.S. Appl. No. 17/947,567, mailed Oct. 23, 2024, 11 pages.

Non-Final Office Action for U.S. Appl. No. 17/946,470, mailed Nov. 20, 2024, 31 pages.

Notice of Allowance for U.S. Appl. No. 17/325,482, mailed Nov. 30, 2022, 8 pages.

Final Office Action for U.S. Appl. No. 17/408,899, mailed Dec. 27, 2022, 13 pages.

Notice of Allowance for U.S. Appl. No. 17/942,472, mailed Oct. 18, 2023, 10 pages.

Corrected Notice of Allowability for U.S. Appl. No. 17/942,472, mailed Nov. 17, 2023, 5 pages.

* cited by examiner

FIG. 3

DETERMINE AN ORDER FOR GENERATING A PLURALITY OF LOW-FREQUENCY CURRENTS ($I_{DC1}$-$I_{DCN}$) IN ONE OR MORE OPERATION PERIODS ($OP_{X-1}$, $OP_X$, $OP_{X+1}$)
202

GENERATE THE PLURALITY OF LOW-FREQUENCY CURRENTS ($I_{DC1}$-$I_{DCN}$) IN EACH OF THE ONE OR MORE OPERATION PERIODS ($OP_{X-1}$, $OP_X$, $OP_{X+1}$) ACCORDING TO THE DETERMINED CURRENT GENERATION ORDER
204

MULTI-VOLTAGE GENERATION CIRCUIT

RELATED APPLICATIONS

This application claims the benefit of provisional patent application Ser. No. 63/255,651, filed Oct. 14, 2021, and provisional patent application Ser. No. 63/255,649, filed Oct. 14, 2021, the disclosures of which are hereby incorporated herein by reference in their entireties.

FIELD OF THE DISCLOSURE

The present disclosure is related to a power management circuit operable to maintain multiple voltages simultaneously.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by such advanced wireless communication technologies as fifth-generation new-radio (5G-NR). To achieve higher data rates, a mobile communication device may employ a power amplifier(s) to amplify a radio frequency (RF) signal(s) (e.g., maintaining sufficient energy per bit) before transmission. Given that the power amplifier(s) requires a supply voltage(s) for operation, a power management integrated circuit (PMIC) is thus required to generate and provide the supply voltage(s) to the power amplifier(s).

Given that the PMIC often needs to concurrently generate multiple supply voltages for multiple power amplifiers, the PMIC typically includes multiple direct-current to direct-current (DC-DC) converters for modulating the multiple supply voltages. Having the multiple DC-DC converters will inevitably increase footprint of the PMIC, thus making it difficult to fit the PMIC into an increasing miniaturized electronic device(s) such as a smartphone and smart gadgets. Hence, it is desirable to reduce the number of DC-DC converters in the PMIC to help reduce the footprint of the PMIC.

SUMMARY

Embodiments of the disclosure relate to a multi-voltage generation circuit. More specifically, the multi-voltage generation circuit includes multiple voltage modulation circuits that are configured to generate and maintain multiple modulated voltages. In a non-limiting example, the multiple modulated voltages can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

In one aspect, a multi-voltage generation circuit is provided. The multi-voltage generation circuit includes a current modulation circuit configured to generate multiple low-frequency currents. The multi-voltage generation circuit also includes multiple voltage modulation circuits. Each of the multiple voltage modulation circuits includes a respective one of multiple voltage amplifiers configured to generate a respective one of multiple modulated initial voltages based on a respective one of multiple modulated target voltages. Each of the multiple voltage modulation circuits also includes a respective one of multiple offset capacitors each modulated to a respective one of multiple offset voltages by a respective one of the multiple low-frequency currents such that the respective one of the multiple offset voltages can raise the respective one of the multiple modulated initial voltages to thereby generate a respective one of multiple modulated voltages. The multi-voltage generation circuit also includes a control circuit. The control circuit is configured to determine an order for generating the multiple low-frequency currents in one or more operation periods. The control circuit is also configured to cause the current modulation circuit to generate the multiple low-frequency currents in each of the one or more operation periods according to the determined order.

In another aspect, a method for generating multiple low-frequency currents is provided. The method includes determining an order for generating multiple low-frequency currents in one or more operation periods. The method also includes generating the multiple low-frequency currents in each of the one or more operation periods according to the determined current generation order.

In another aspect, a multi-voltage power management circuit is provided. The multi-voltage power management circuit includes multiple power amplifier circuits. The multiple power amplifier circuits are configured to concurrently amplify multiple radio frequency (RF) signals based on multiple modulated voltages, respectively. The multi-voltage power management circuit also includes a multi-voltage generation circuit. The multi-voltage generation circuit includes a current modulation circuit configured to generate multiple low-frequency currents. The multi-voltage generation circuit also includes multiple voltage modulation circuits. Each of the multiple voltage modulation circuits includes a respective one of multiple voltage amplifiers configured to generate a respective one of multiple modulated initial voltages based on a respective one of multiple modulated target voltages. Each of the multiple voltage modulation circuits also includes a respective one of multiple offset capacitors each modulated to a respective one of multiple offset voltages by a respective one of the multiple low-frequency currents such that the respective one of the multiple offset voltages can raise the respective one of the multiple modulated initial voltages to thereby generate a respective one of the multiple modulated voltages. The multi-voltage generation circuit also includes a control circuit. The control circuit is configured to determine an order for generating the multiple low-frequency currents in one or more operation periods. The control circuit is also configured to cause the current modulation circuit to generate the plurality of low-frequency currents in each of the one or more operation periods according to the determined order.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
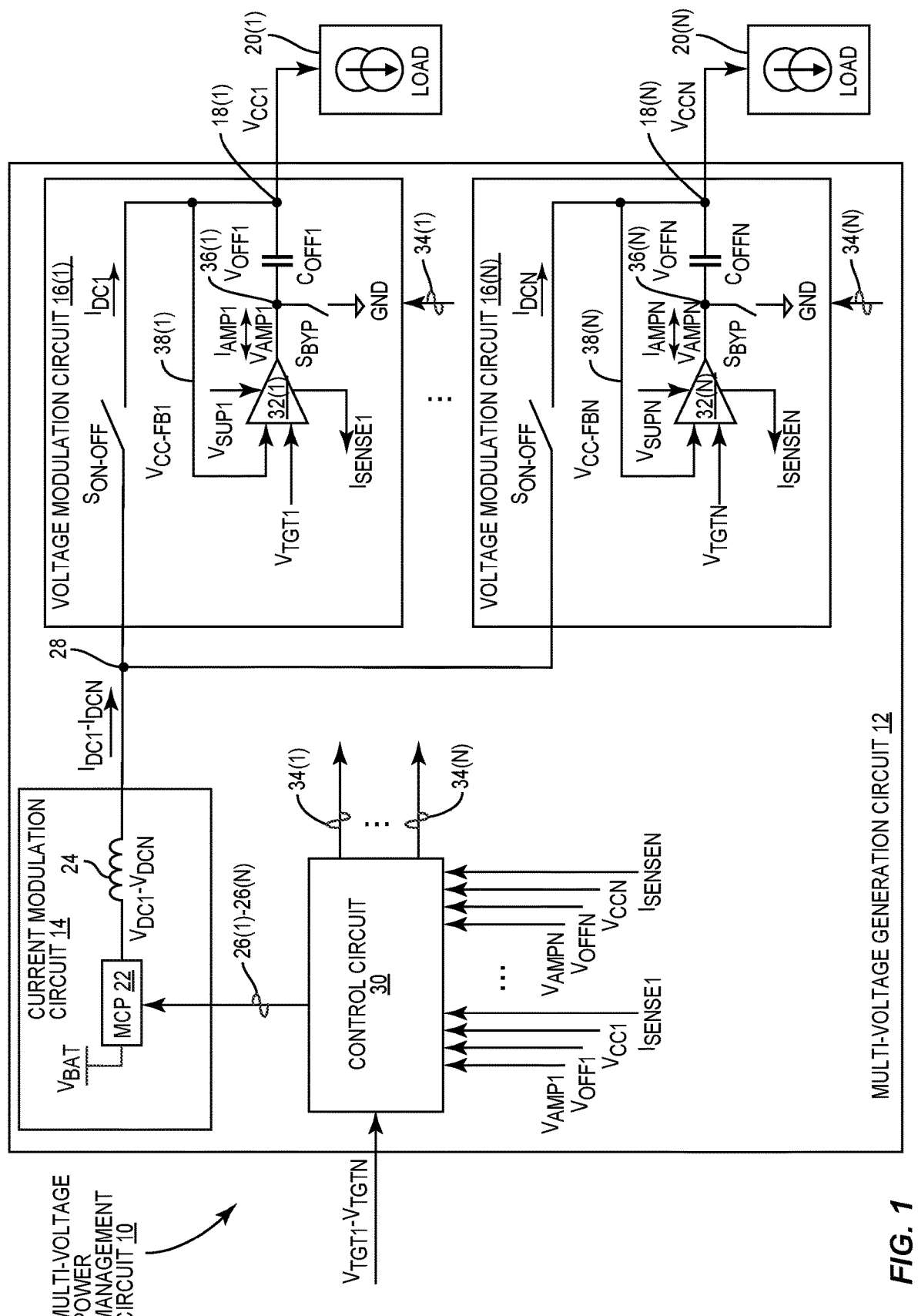
FIG. 1 is a schematic diagram of an exemplary multi-voltage power management circuit wherein a multi-voltage generation circuit is configured according to embodiments of the present disclosure to concurrently generate and maintain multiple modulated voltages by sharing a current modulation circuit.
Figure 3:
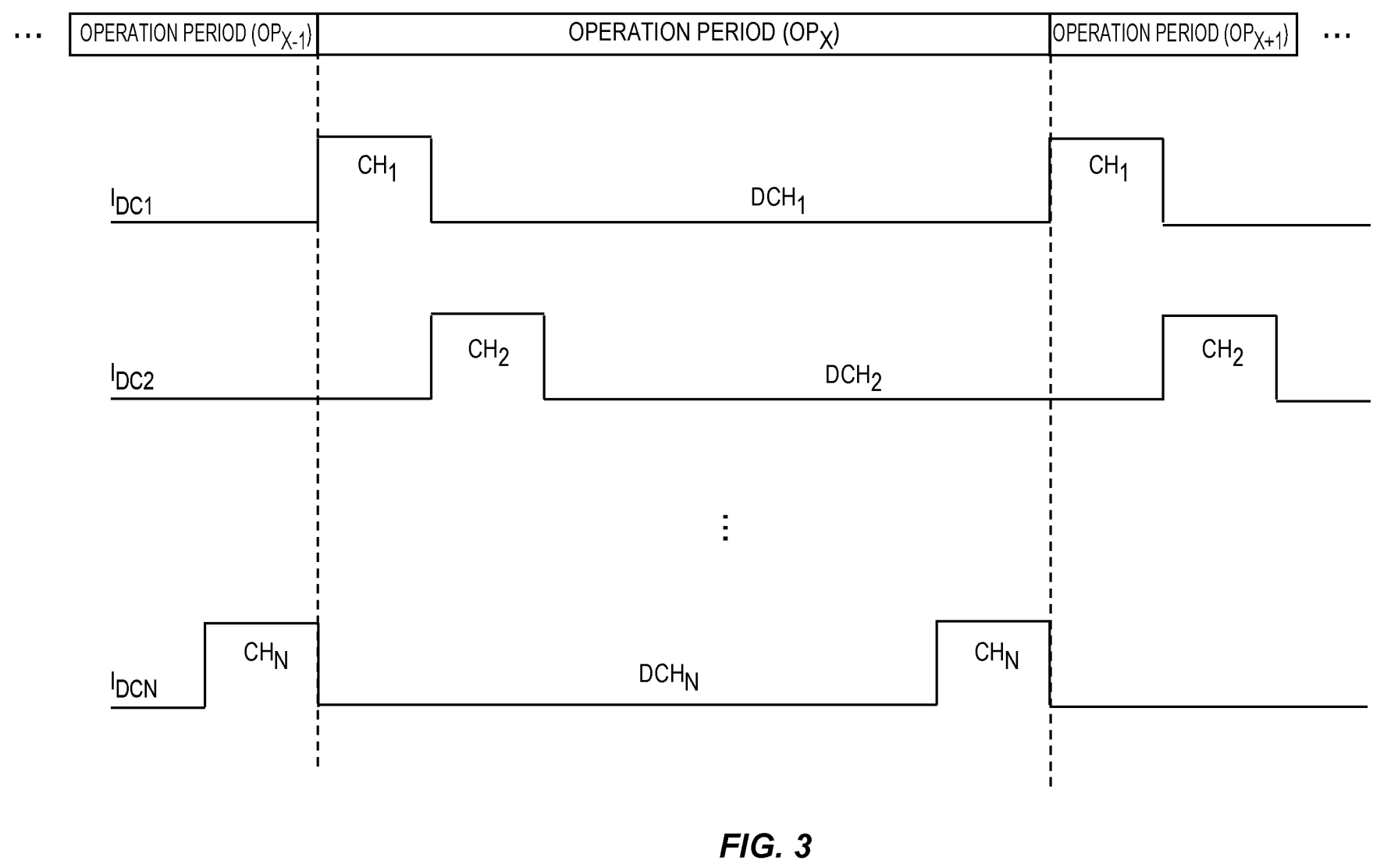
Figure 4:
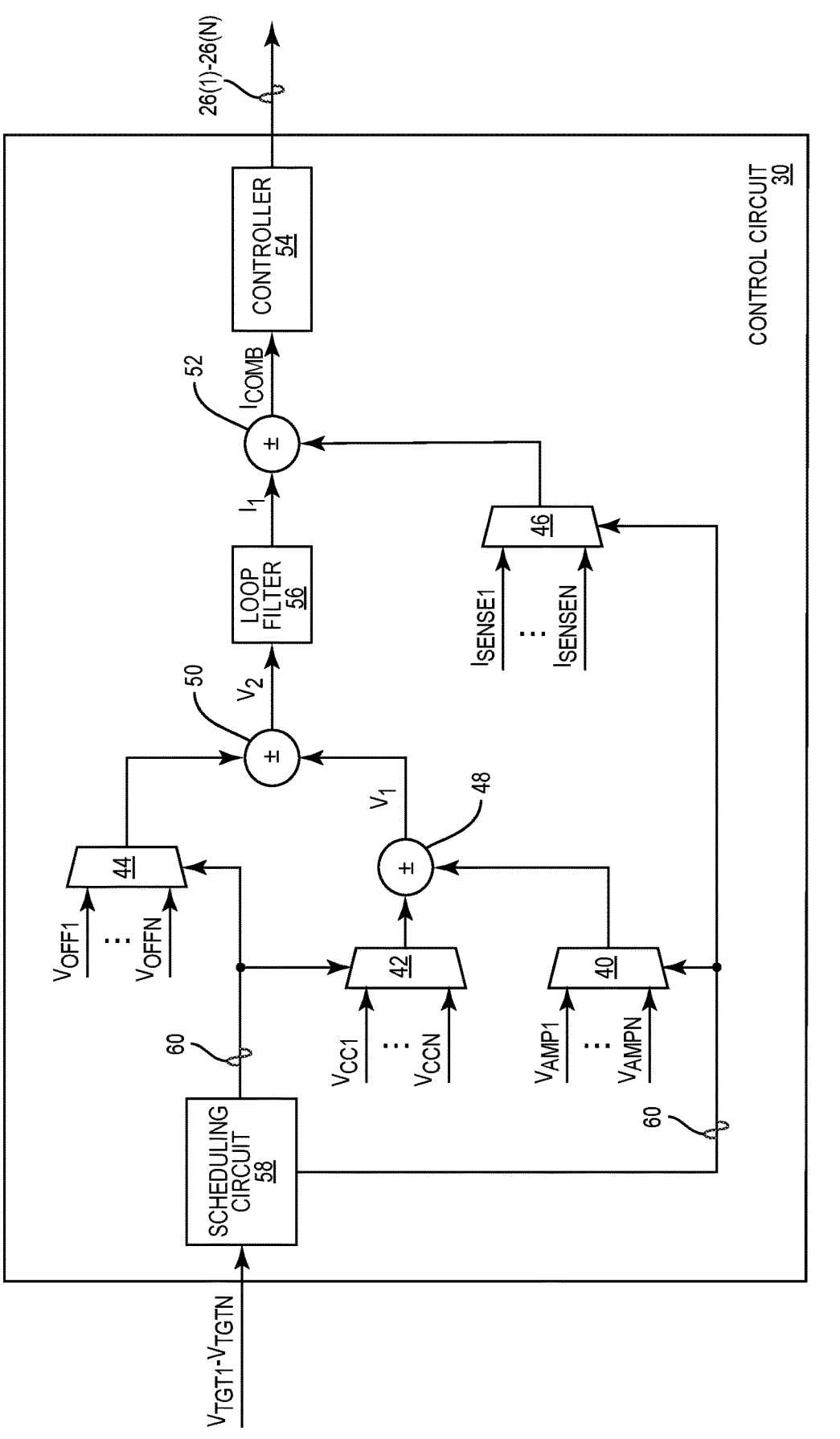
Figure 5:
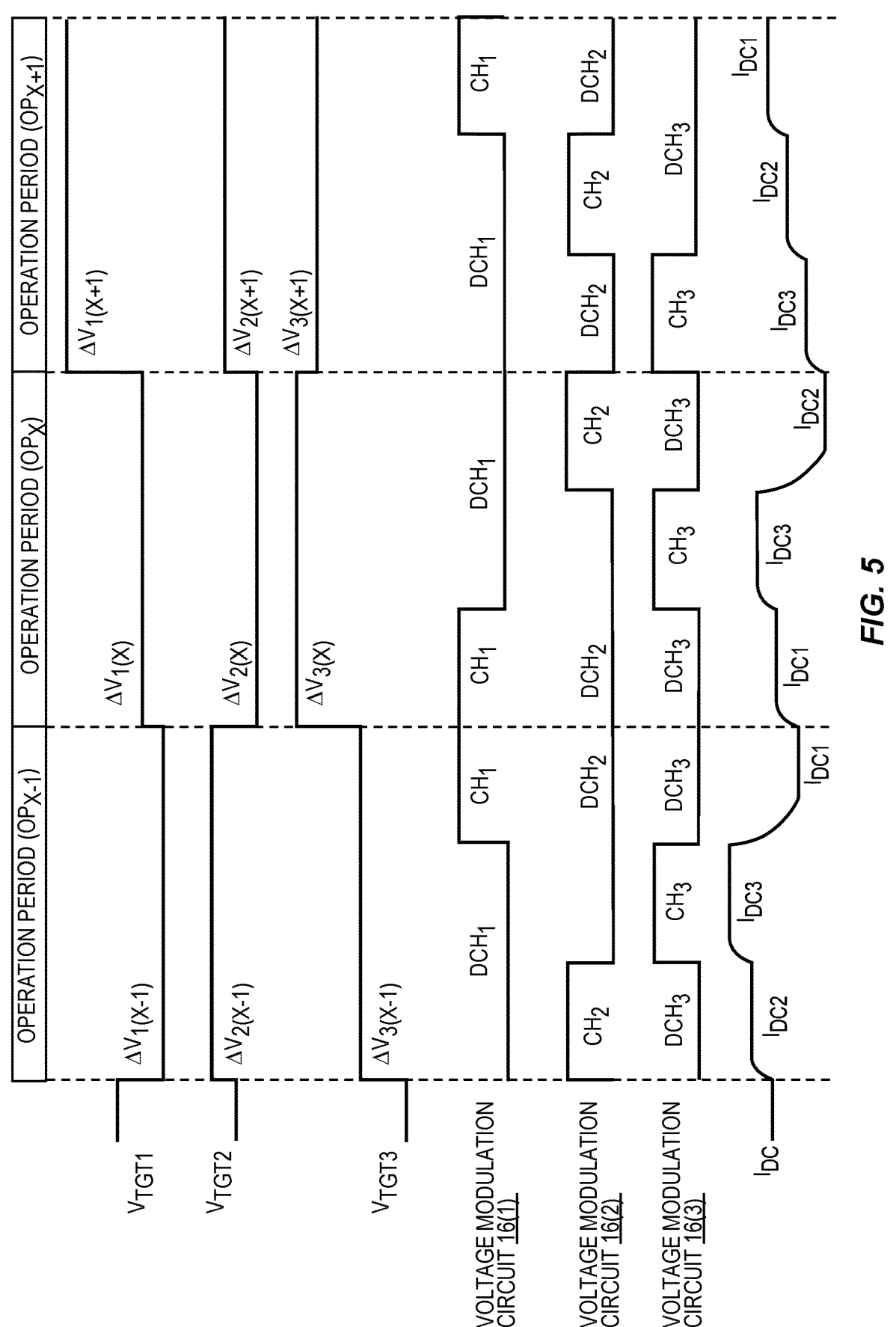
Figure 6:
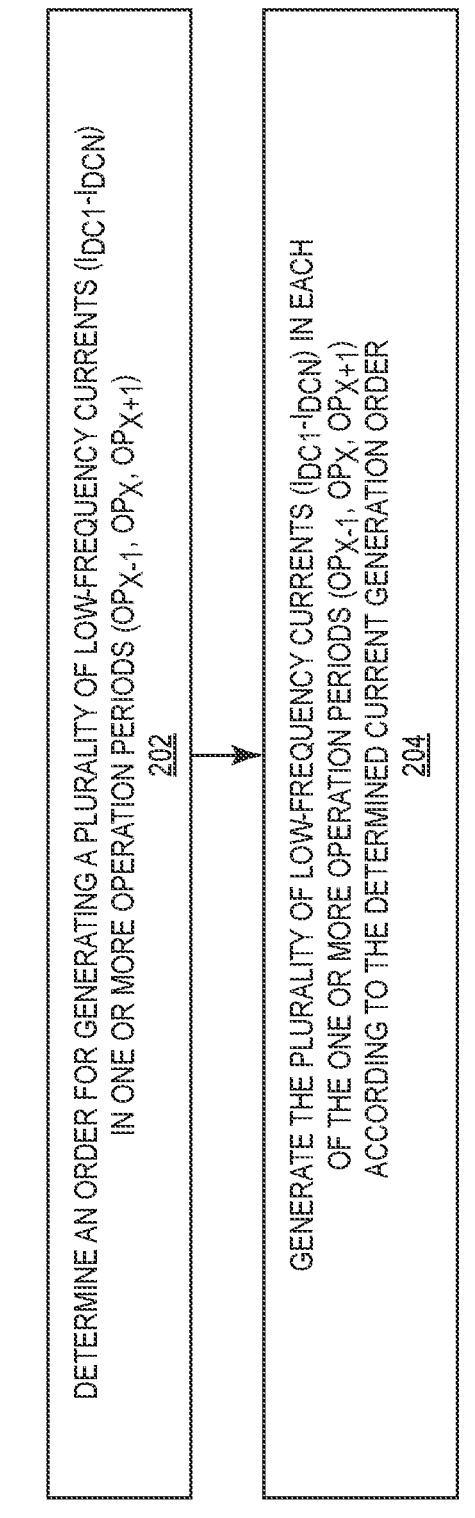

FIG. 3 provides an exemplary illustration of a time-division scheme that can be employed by the multi-voltage generation circuit in FIG. 1 for concurrently generating and maintaining the multiple modulated voltages;

FIG. 4 is a schematic diagram of an exemplary control circuit that can be provided in the multi-voltage generation circuit in FIG. 1 for generating and maintaining the multiple modulated voltages concurrently;

FIG. 5 provides an exemplary illustration as to how the control circuit in FIG. 4 can determine the time-division scheme in FIG. 3 based on a current generation order; and FIG. 6 is a flowchart of an exemplary process for generating multiple low-frequency currents to cause the multi-voltage generation circuit in FIG. 1 to generate and maintain the modulated voltages.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a multi-voltage generation circuit. More specifically, the multi-voltage generation circuit includes multiple voltage modulation circuits that are configured to generate and maintain multiple modulated voltages. In a non-limiting example, the multiple modulated voltage can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

In this regard, FIG. 1 is a schematic diagram of an exemplary multi-voltage power management circuit 10 wherein a multi-voltage generation circuit 12 is configured according to embodiments of the present disclosure to concurrently generate and maintain multiple modulated voltages $V_{CC1}$-$V_{CCN}$ by sharing a current modulation circuit 14. Herein, the multi-voltage generation circuit 12 includes multiple voltage modulation circuits 16(1)-16(N) each configured to share the current modulation circuit 14 based on time-division to thereby generate and maintain a respective one of the modulated voltages $V_{CC1}$-$V_{CCN}$. The voltage modulation circuits 16(1)-16(N) are configured to output the modulated voltages $V_{CC1}$-$V_{CCN}$ via multiple voltage outputs 18(1)-18(N), respectively.

In an embodiment, the voltage outputs $18(1)$-$18(N)$ are coupled to multiple load circuits $20(1)$-$20(N)$, respectively. In this regard, the voltage modulation circuits $16(1)$-$16(N)$ are configured to concurrently provide and maintain the modulated voltages $V_{CC1}$-$V_{CCN}$ for the load circuits $20(1)$-$20(N)$. In a non-limiting example, the load circuits $20(1)$-$20(N)$ can be power amplifier circuits each configured to amplify a respective one of multiple RF signals (not shown) based on a respective one of the modulated voltages $V_{CC1}$-$V_{CCN}$. Understandably, the load circuits $20(1)$-$20(N)$ can also be any other active circuits that operate based on a voltage. Further, the load circuits $20(1)$-$20(N)$ may also include a mixture of power amplifier circuits and other types of active circuits. By sharing the current modulation circuit $14$ among the voltage modulation circuits $16(1)$-$16(N)$, the multi-voltage power management circuit $10$ can concurrently support the load circuits $20(1)$-$20(N)$ with significantly reduced footprint.

According to an embodiment of the present disclosure, the current modulation circuit $14$ includes a multi-level charge pump (MCP) $22$ and a power inductor $24$. The MCP $22$ is configured to operate based on a plurality of duty cycles $26(1)$-$26(N)$ to generate a plurality of low-frequency voltages $V_{DC1}$-$V_{DCN}$ (e.g., DC voltages), each as a function of a battery voltage $V_{BAT}$. In a non-limiting example, the MCP $22$ can be a DC-DC buck-boost converter that can operate in a buck mode and/or a boost mode. Herein, the MCP $22$ is configured to generate each of the low-frequency voltages $V_{DC1}$-$V_{DCN}$ at $0 \times V_{BAT}$ or $1 \times V_{BAT}$ when operating in the buck mode, or at $2 \times V_{BAT}$ when operating in the boost mode. Understandably, the MCP $22$ can toggle between $0 \times V_{BAT}$, $1 \times V_{BA}$, and/or $2 \times V_{BAT}$ based on a respective one of the duty cycles $26(1)$-$26(N)$ to thereby generate each of the low-frequency voltages $V_{DC1}$-$V_{DCN}$ at any desired voltage level. In other words, it is possible to adjust the low-frequency voltages $V_{DC1}$-$V_{DCN}$ by simply adjusting the duty cycles $26(1)$-$26(N)$.

The power inductor $24$ is coupled between the MCP $22$ and a common node $28$. Herein, the power inductor $24$ is configured to induce a multiple low-frequency current $I_{DC1}$-$I_{DCN}$ (e.g., a DC current) based on the low-frequency voltages $V_{DC1}$-$V_{DCN}$, respectively. Given that the low-frequency voltages $V_{DC1}$-$V_{DCN}$ can be adjusted based on the duty cycles $26(1)$-$26(N)$, the low-frequency currents $I_{DC1}$-$I_{DCN}$ can likewise be adjusted based on the duty cycles $26(1)$-$26(N)$.

In an embodiment, the multi-voltage generation circuit $12$ further includes a control circuit $30$, which can be a field-programmable gate array (FPGA) or an application-specific integrated circuit (ASIC), as an example. As further discussed in FIG. $4$, the control circuit $30$ can be configured to adjust each of the duty cycles $26(1)$-$26(N)$ based on a variety of feedback provided by the voltage modulation circuits $16(1)$-$16(N)$. In addition, the control circuit $30$ is further configured to determine a time-division schedule whereby the voltage modulation circuits $16(1)$-$16(N)$ can share the current modulation circuit $14$.

In an embodiment, each of the voltage modulation circuits $16(1)$-$16(N)$ includes a respective one of multiple voltage amplifiers $32(1)$-$32(N)$, a respective one of multiple offset capacitors $C_{OFF1}$-$C_{OFFN}$, a respective bypass switch $S_{BYP}$, and a respective on-off switch $S_{ON-OFF}$. In a non-limiting example, the control circuit $30$ can control (e.g., toggle) the bypass switch $S_{BYP}$ and the on-off switch $S_{ON-OFF}$ in each of the voltage modulation circuits $16(1)$-$16(N)$ via a respective one of multiple control signals $34(1)$-$34(N)$.

Each of the voltage amplifiers $32(1)$-$32(N)$ is configured to generate a respective one of multiple modulated initial voltages $V_{AMP1}$-$V_{AMPN}$ at a respective one of multiple outputs $36(1)$-$36(N)$ based on a respective one of multiple modulated target voltages $V_{TGT1}$-$V_{TGTN}$ and a respective one of multiple supply voltages $V_{SUP1}$-$V_{SUPN}$. For example, the voltage amplifier $32(1)$ generates the modulated initial voltage VAMP1 at the output $36(1)$ of the voltage amplifier $32(1)$ based on the modulated target voltage $V_{TGT1}$ and the supply voltage $V_{SUP1}$, and the voltage amplifier $32(N)$ generates the modulated initial voltage $V_{AMPN}$ at the output $36(N)$ of the voltage amplifier $32(N)$ based on the modulated target voltage $V_{TGTN}$ and the supply voltage $V_{SUPN}$.

In an embodiment, each of the voltage amplifiers $32(1)$-$32(N)$ may be configured to source or sink a respective one of multiple high-frequency current $I_{AMP1}$-$I_{AMPN}$ (e.g., alternating currents) to help maintain a respective one of the modulated voltages $V_{CC1}$-$V_{CCN}$ at a desired level. In this regard, each of the voltage amplifiers $32(1)$-$32(N)$ may generate a respective one of multiple sense currents $I_{SENSE1}$-$I_{SENSEN}$ to indicate an amount of the respective one of the high-frequency current $I_{AMP1}$-$I_{AMPN}$ that is sourced or sunk by the respective one of the voltage amplifiers $32(1)$-$32(N)$.

Each of the offset capacitors $C_{OFF1}$-$C_{OFFN}$ is coupled between a respective one of the outputs $36(1)$-$36(N)$ and a respective one of the voltage outputs $18(1)$-$18(N)$. For example, the offset capacitor $C_{OFF1}$ is coupled between the output $36(1)$ of the voltage amplifier $32(1)$ and the voltage output $18(1)$ of the voltage modulation circuit $16(1)$, and the offset capacitor $C_{OFFN}$ is coupled between the output $36(N)$ of the voltage amplifier $32(N)$ and the voltage output $18(N)$ of the voltage modulation circuit $16(N)$. Each of the offset capacitors $C_{OFF1}$-$C_{OFFN}$ is configured to raise a respective one of the modulated voltages $V_{AMP1}$-$V_{AMPN}$ by a respective one of multiple offset voltages $V_{OFF1}$-$V_{OFFN}$ to thereby generate a respective one of the modulated voltages $V_{CC1}$-$V_{CCN}$ at a respective one of the voltage outputs $18(1)$-$18(N)$. For example, the offset capacitor $C_{OFF1}$ is configured to raise the modulated initial voltage $V_{AMP1}$ by the offset voltage $V_{OFF1}$ to thereby generate the modulated voltage $V_{CC1}$ ($V_{CC1} = V_{AMP1} + V_{OFF1}$) at the voltage output $18(1)$, and the offset capacitor $C_{OFFN}$ is configured to raise the modulated initial voltage $V_{AMPN}$ by the offset voltage $V_{OFFN}$ to thereby generate the modulated voltage $V_{CCN}$ ($V_{CCN} = V_{AMPN} + V_{OFFN}$) at the voltage output $18(N)$.

In one embodiment, the offset capacitors $C_{OFF1}$-$C_{OFFN}$ can be configured to have an identical capacitance. In an alternative embodiment, the offset capacitors $C_{OFF1}$-$C_{OFFN}$ can also be configured to have different capacitances. Further, the offset capacitors $C_{OFF1}$-$C_{OFFN}$ can also be a same type or different types of capacitors.

The bypass switch $S_{BYP}$ in each of the voltage modulation circuits $16(1)$-$16(N)$ is coupled between a respective one of the outputs $36(1)$-$36(N)$ and a ground (GND). For example, the bypass switch $S_{BYP}$ in the voltage modulation circuit $16(1)$ is coupled between the output $36(1)$ of the voltage amplifier $32(1)$ and the GND, and the bypass switch $S_{BYP}$ in the voltage modulation circuit $16(N)$ is coupled between the output $36(N)$ of the voltage amplifier $32(N)$ and the GND.

The on-off switch $S_{ON-OFF}$ in each of the voltage modulation circuits $16(1)$-$16(N)$ is coupled between the common node $28$ and a respective one of the voltage outputs $18(1)$-$18(N)$. For example, the on-off switch $S_{ON-OFF}$ in the voltage modulation circuit $16(1)$ is coupled between the common node $28$ and the voltage output $18(1)$ of the voltage modulation circuit $16(1)$, and the on-off switch $S_{ON-OFF}$ in the voltage modulation circuit 16(N) is coupled between the common node 28 and the voltage output 18(N) of the voltage modulation circuit 16(N).

In an embodiment, the on-off switch $S_{ON-OFF}$ in each of the voltage modulation circuits 16(1)-16(N) can be closed to provide a respective one of the low-frequency currents $I_{DC1}$-$I_{DCN}$ from the common node 28 to a respective one of the voltage outputs 18(1)-18(N). In contrast, the on-off switch $S_{ON-OFF}$ in each of the voltage modulation circuits 16(1)-16(N) can be opened to prevent the respective one of the low-frequency currents $I_{DC1}$-$I_{DCN}$ from flowing from the common node 28 to the respective one of the voltage outputs 18(1)-18(N).

Each of the voltage modulation circuits 16(1)-16(N) further includes a respective one of multiple voltage feedback paths 38(1)-38(N). Each of the voltage feedback paths 38(1)-38(N) is configured to provide a respective one of multiple modulated voltage feedbacks $V_{CC-FB1}$-$V_{VCC-FBN}$ from a respective one of the voltage outputs 18(1)-18(N) to a respective input of the voltage amplifiers 32(1)-32(N). In this regard, each of the voltage modulation circuits 16(1)-16(N) is a closed-loop voltage modulation circuit.

Each of the voltage modulation circuits 16(1)-16(N) can be configured to generate and maintain a respective one of the modulated voltages $V_{CC1}$-$V_{CCN}$ based on operations described below. Herein, operations of the voltage modulation circuit 16(1) are discussed as a non-limiting example. Understandably, the operation principles described with reference to the voltage modulation circuit 16(1) are applicable to any of the voltage modulation circuits 16(1)-16(N).

Figure 2:
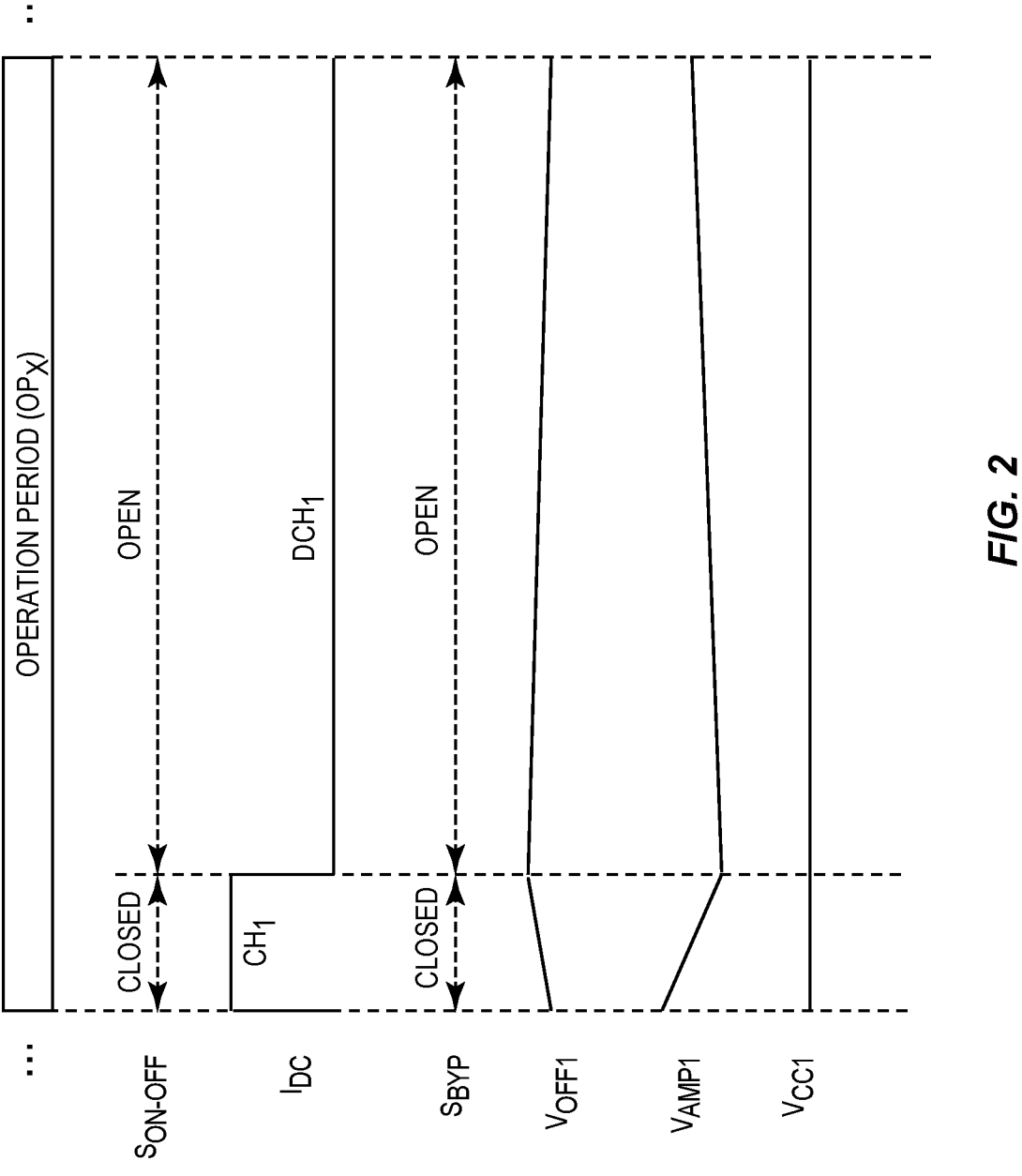
FIG. 2 illustrates an exemplary operation of a voltage modulation circuit for generating and maintaining any one of the multiple modulated voltages during an operation period(s)

In essence, the voltage modulation circuit 16(1) can be configured to generate and maintain the modulated voltage $V_{CC1}$ by toggling repeatedly between a charge interval and a discharge interval. FIG. 2 illustrates an exemplary operation of the voltage modulation circuit 16(1) for generating and maintain the modulated voltage $V_{CC1}$ by toggling between a charge interval $CH_1$ and a discharge interval $DCH_1$ during an operation period $OP_X$. Common elements between FIGS. 1 and 2 are shown therein with common element numbers and will not be re-described herein.

During the charge interval $CH_1$, the control circuit 30 closes the on-off switch $S_{ON-OFF}$ and the bypass switch $S_{BYP}$ such that the low-frequency current $I_{DC1}$ can flow from the common node 28 through the offset capacitor $C_{OFF1}$ and to the GND to thereby charge the offset capacitor $C_{OFF1}$ to the offset voltage $V_{OFF1}$. While the offset capacitor $C_{OFF}$ is being charged, the control circuit 30 activates the voltage amplifier 32(1) to generate the modulated initial voltage $V_{AMP1}$ to help maintain the modulated voltage $V_{CC1}$ at a desired level.

Once the offset capacitor $C_{OFF1}$ is charged up to the offset voltage $V_{OFF1}$, the voltage modulation circuit 16(1) will enter the discharge interval $DCH_1$. During the discharge interval $DCH_1$, the control circuit 30 opens the on-off switch $S_{ON-OFF}$ and the bypass switch $S_{BYP}$ concurrently. In this regard, the low-frequency current $I_{DC1}$ is blocked from the common node and the offset capacitor $C_{OFF1}$ is gradually discharged to maintain the modulated voltage $V_{CC1}$ at the desired level.

As shown in FIG. 2, during the charge interval $CH_1$, the voltage amplifier 32(1) may gradually reduce the modulated initial voltage $V_{AMP1}$ as the offset capacitor $C_{OFF1}$ is charged to gradually increase the offset voltage $V_{OFF1}$. In contrast, during the discharge interval $DCH_1$, the offset voltage $V_{OFF1}$ will gradually decrease as the offset capacitor $C_{OFF1}$ is discharged. Accordingly, the voltage amplifier 32(1) may gradually increase the modulated initial voltage $V_{AMP1}$. As such, the voltage modulation circuit 16(1) can maintain the modulated voltage $V_{CC1}$ consistently at the desired level.

In an embodiment, the voltage amplifier 32(1) may source or sink the high-frequency current $I_{AMP1}$ to help charge or discharge a holding capacitor (not shown) in the load circuit 20(1) to thereby help maintain the modulated voltage $V_{CC1}$ at the desired level. In this regard, the voltage amplifier 32(1) will generate the sense current $I_{SENSE1}$ to indicate the high-frequency current $I_{AMP1}$ that is sourced or sunk by the voltage amplifier 32(1).

With reference back to FIG. 1, each of the voltage modulation circuits 16(2)-16(N) can be configured to generate and maintain a respective one of the modulated voltages $V_{CC2}$-$V_{CCN}$ by toggling repeatedly between a respective charge interval and a respective discharge interval as described above in the example of the voltage modulation circuit 16(1). In this regard, the control circuit 30 is configured to determine the respective charge interval and the respective discharge interval for each of the voltage modulation circuits 16(1)-16(N) such that the voltage modulation circuits 16(1)-16(N) can share the current modulation circuit 14 on a time-division basis.

FIG. 3 provides an exemplary illustration of a time-division operation among the voltage modulation circuits 16(1)-16(N) in FIG. 1. Common elements between FIGS. 1 and 3 are shown therein with common element numbers and will not be re-described herein.

Notably, the time-division operation is repeated in each of one or more operation periods $OP_{X-1}$, $OP_X$, $OP_{X+1}$. Notably, the operation periods $OP_{X-1}$, $OP_X$, $OP_{X+1}$ are merely examples for the purpose of illustration. It should be appreciated that the time-division operation can be repeated over any number of operation periods as needed.

Specifically, during the operation period $OP_X$, the control circuit 30 determines multiple charge intervals $CH_1$-$CH_N$ and multiple discharge intervals $DCH_1$-$DCH_N$ for the voltage modulation circuits 16(1)-16(N), respectively. As shown in FIG. 3, the charge intervals $CH_1$-$CH_N$ are so determined not to overlap with one another. In contrast, the discharge intervals $DCH_1$-$DCH_N$ may overlap with one another.

The charge intervals $CH_1$-$CH_N$ can be of equal duration or different durations, depending on whether the offset capacitors $C_{OFF1}$-$C_{OFFN}$ are having an identical capacitance or different capacitances. Specifically, when the offset capacitors $C_{OFF1}$-$C_{OFFN}$ are having the identical capacitance, the charge intervals $CH_1$-$CH_N$ can have an identical duration. In contrast, when the offset capacitors $C_{OFF1}$-$C_{OFFN}$ are having different capacitances, the charge intervals $CH_1$-$CH_N$ can have different durations. Regardless, a total duration of the charge intervals $CH_1$-$CH_N$ shall be less than or equal to the duration of the operation period $OP_X$.

In this regard, each of the voltage modulation circuits 16(1)-16(N) toggles between a respective one of the charge intervals $CH_1$-$CH_N$ and a respective one of the discharge intervals $DCH_1$-$DCH_N$ to generate and maintain a respective one of the modulated voltages $V_{CC1}$-$V_{CCN}$. The voltage modulation circuits 16(1)-16(N) can make the modulated voltages $V_{CC1}$-$V_{CCN}$ concurrently available to enable simultaneous operations of the load circuits 20(1)-20(N), despite operating based on the time-division scheme.

With reference back to FIG. 1, since the modulated voltages $V_{CC1}$-$V_{CCN}$ can be at different voltage levels, the control circuit 30 needs to adjust the duty cycles 26(1)-26(N) accordingly for each of the voltage modulation circuits 16(1)-16(N). According to an embodiment of the present disclosure, the control circuit 30 may determine the duty cycles 26(1)-26(N) for a respective one of the voltage modulation circuits $16(1)$-$16(N)$ based on one or more of: a respective one of the modulated initial voltages $V_{AMP1}$-$V_{AMPN}$, a respective one of the offset voltages $V_{OFF1}$-$V_{OFFN}$, a respective one of the modulated voltages $V_{CC1}$-$V_{CCN}$, and a respective one of the sense currents $I_{SENSE1}$-$I_{SENSEN}$.

FIG. 4 is a schematic diagram providing an exemplary illustration of the control circuit 30 in FIG. 1 configured according to an embodiment of the present disclosure. Common elements between FIGS. 1 and 4 are shown therein with common element numbers and will not be re-described herein.

Herein, the control circuit 30 includes a first multiplexer 40, a second multiplexer 42, a third multiplexer 44, a fourth multiplexer 46, a first combiner 48, a second combiner 50, a third combiner 52, a controller 54, and a loop filter 56.

When determining a respective one of the duty cycles $26(1)$-$26(N)$ for a respective one of the voltage modulation circuits $16(1)$-$16(N)$, the first multiplexer 40 outputs a respective one of the modulated initial voltages $V_{AMP1}$-$V_{AMPN}$, the second multiplexer 42 outputs a respective one of the modulated voltages $V_{CC1}$-$V_{CCN}$, the third multiplexer 44 outputs a respective one of the offset voltages $V_{OFF1}$-$V_{OFFN}$, and the fourth multiplexer 46 outputs a respective one of the sense currents $I_{SENSE1}$-$I_{SENSEN}$.

The first combiner 48 combines the respective one of the modulated initial voltages $V_{AMP1}$-$V_{AMPN}$ and the respective one of the modulated voltages $V_{CC1}$-$V_{CCN}$ to output a first combined voltage $V_1$. The second combiner 50 combines the first combined voltage $V_1$ with the respective one of the offset voltages $V_{OFF1}$-$V_{OFFN}$ to output a second voltage $V_2$. The loop filter 56 is configured to convert the second voltage $V_2$ into a first current $I_1$, which is combined with the respective one of the sense currents $I_{SENSE1}$-$I_{SENSEN}$ at the third combiner 52 to generate a combined current $I_{COMB}$. The controller 54, which can be a bang-bang controller as an example, can then determine the respective one of the duty cycles $26(1)$-$26(N)$ for the respective one of the voltage modulation circuits $16(1)$-$16(N)$ based on the combined current $I_{COMB}$.

Notably, since the modulated voltages $V_{CC1}$-$V_{CCN}$ can be different from one another in each of the operation periods $OP_{X-1}$, $OP_X$, $OP_{X+1}$, and so on, the current modulation circuit 14 needs to adapt the low-frequency currents $I_{DC1}$-$I_{DCN}$ accordingly in each of the operation periods $OP_{X-1}$, $OP_X$, $OP_{X+1}$, and so on. As such, it is desirable to minimize an amount of current change (increase or decrease) between each of the low-frequency currents $I_{DC1}$-$I_{DCN}$ to help improve efficiency of the current modulation circuit 14.

In this regard, the control circuit 30 can further include a scheduling circuit 58 to determine an order (also referred to as "current generation order") for generating the low-frequency currents $I_{DC1}$-$I_{DCN}$ in each of the operation periods $OP_{X-1}$, $OP_X$, $OP_{X+1}$, and so on. Accordingly, the control circuit 30 can determine the duty cycles $26(1)$-$26(N)$ according to the determined current generation order to thereby cause the current modulation circuit 14 to generate the low-frequency currents $I_{DC1}$-$I_{DCN}$ according to the determined current generation order.

In a non-limiting example, once the scheduling circuit 58 determines the current generation order for a respective one of the operation periods $OP_{X-1}$, $OP_X$, $OP_{X+1}$, and so on, the scheduling circuit 58 can control the first multiplexer 40, the second multiplexer 42, the third multiplexer 44, and the fourth multiplexer 46 via a selection signal 60. As such, the scheduling circuit 58 can cause the modulated initial voltages $V_{AMP1}$-$V_{AMPN}$, the modulated voltages $V_{CC1}$-$V_{CCN}$, the offset voltages $V_{OFF1}$-$V_{OFFN}$, and the sense currents $I_{SENSE1}$-$I_{SENSEN}$ to be outputted from the first multiplexer 40, the second multiplexer 42, the third multiplexer 44, and the fourth multiplexer 46 in accordance with the determined current generation order. Accordingly, the control circuit 30 can generate the duty cycles $26(1)$-$26(N)$ in accordance with the determined current generation order.

According to an embodiment of the present disclosure, the scheduling circuit 58 is configured to determine the current generation order (e.g., based on the modulated target voltages $V_{TGT1}$-$V_{TGTN}$) to minimize a relative change between each of the low-frequency currents $I_{DC1}$-$I_{DCN}$ in each of the operation periods $OP_{X-1}$, $OP_X$, $OP_{X+1}$, and so on. In this regard, FIG. 5 provides an exemplary illustration as to how the control circuit 30 in FIG. 4 can determine the charge intervals $CH_1$-$CH_N$ and the discharge intervals $DCH_1$-$DCH_N$ in FIG. 3 based on the determined current generation order. For the sake of illustration, FIG. 5 is described with reference to the voltage modulation circuits $16(1)$-$16(3)$ among the voltage modulation circuits $16(1)$-$16(N)$.

In one example, the scheduling circuit 58 receives the modulated target voltages $V_{TGT1}$, $V_{TGT2}$, and $V_{TGT3}$ that indicate changes of the modulated voltages $V_{CC1}$, $V_{CC2}$, and $V_{CC3}$ in the operation period $OP_{X-1}$ relative to what were in a prior operation period (e.g., $OP_{X-2}$) are $\Delta V_{1(X-1)}$, $\Delta V_{2(X-1)}$, and $\Delta V_{3(X-1)}$, respectively. The scheduling circuit 58 further determines that $\Delta V_{2(X-1)} < \Delta V_{3(X-1)} < \Delta V_{1(X-1)}$. Accordingly, the scheduling circuit 58 can determine the current generation order in the operation period $OP_{X-1}$ to be $I_{DC2}$, $I_{DC3}$, and $I_{DC1}$. In this regard, the control circuit 30 will generate the duty cycles $26(2)$, $26(3)$, and $26(1)$ to cause the current modulation circuit 14 to generate the low-frequency currents $I_{DC2}$, $I_{DC3}$, and $I_{DC1}$, respectively. Given the current generation order, the control circuit 30 will also determine the charge intervals $CH_2$, $CH_3$, and $CH_1$ in the operation period $OP_{X-1}$ for charging the offset capacitors $C_{OFF2}$, $C_{OFF3}$, and $C_{OFF1}$, respectively. Upon determining the charge intervals $CH_2$, $CH_3$, and $CH_1$, the control circuit 30 can further determine the discharge intervals $DCH_2$, $DCH_3$, and $DCH_1$ accordingly.

In another example, the scheduling circuit 58 receives the modulated target voltages $V_{TGT1}$, $V_{TGT2}$, and $V_{TGT3}$ that indicate changes of the modulated voltages $V_{CC1}$, $V_{CC2}$, and $V_{CC3}$ in the operation period $OP_X$ relative to what were in a prior operation period (e.g., $OP_{X-1}$) are $\Delta V_{1(X)}$, $\Delta V_{2(X)}$, and $\Delta V_{3(X)}$, respectively. The scheduling circuit 58 further determines that $\Delta V_{1(X)} < \Delta V_{3(X)} < \Delta V_{2(X)}$. Accordingly, the scheduling circuit 58 can determine the current generation order in the operation period $OP_X$ to be $I_{DC1}$, $I_{DC3}$, and $I_{DC2}$. In this regard, the control circuit 30 will generate the duty cycles $26(1)$, $26(3)$, and $26(2)$ to cause the current modulation circuit 14 to generate the low-frequency currents $I_{DC1}$, $I_{DC3}$, and $I_{DC2}$, respectively. Given the current generation order, the control circuit 30 will also determine the charge intervals $CH_1$, $CH_3$, and $CH_2$ in the operation period $OP_X$ for charging the offset capacitors $C_{OFF1}$, $C_{OFF3}$, and $C_{OFF2}$, respectively. Upon determining the charge intervals $CH_1$, $CH_3$, and $CH_2$, the control circuit 30 can further determine the discharge intervals $DCH_1$, $DCH_3$, and $DCH_2$ accordingly.

In another example, the scheduling circuit 58 receives the modulated target voltages $V_{TGT1}$, $V_{TGT2}$, and $V_{TGT3}$ that indicate changes of the modulated voltages $V_{CC1}$, $V_{CC2}$, and $V_{CC3}$ in the operation period $OP_{X+1}$ relative to what were in a prior operation period (e.g., $OP_X$) are $\Delta V_{1(X+1)}$, $\Delta V_{2(X+1)}$, and $\Delta V_{3(X+1)}$, respectively. The scheduling circuit 58 further determines that $\Delta V_{3(X+1)} < \Delta V_{2(X+1)} < \Delta V_{1(X+1)}$. Accordingly, the scheduling circuit 58 can determine the current generation order in the operation period $OP_{X+1}$ to be $I_{DC3}$, $I_{DC2}$, and $I_{DC1}$. In this regard, the control circuit 30 will generate the duty cycles 26(3), 26(2), and 26(1) to cause the current modulation circuit 14 to generate the low-frequency currents $I_{DC3}$, $I_{DC2}$, and $I_{DC1}$, respectively. Given the current generation order, the control circuit 30 will also determine the charge intervals $CH_3$, $CH_2$, and $CH_1$ in the operation period $OP_{X+1}$ for charging the offset capacitors $C_{OFF3}$, $C_{OFF2}$, and $C_{OFF1}$, respectively. Upon determining the charge intervals $CH_3$, $CH_2$, and $CH_1$, the control circuit 30 can further determine the discharge intervals $DCH_3$, $DCH_2$, and $DCH_1$ accordingly.

The multi-voltage generation circuit 12 in FIG. 2 can be configured to generate the low-frequency currents $I_{DC1}$-$I_{DCN}$ according to a process. In this regard, FIG. 6 is a flowchart of an exemplary process 200 for generating the low-frequency currents $I_{DC1}$-$D_{DCN}$ to cause the multi-voltage generation circuit 12 in FIG. 1 to generate and maintain the modulated voltages $V_{CC1}$-$V_{CCN}$.

Herein, the control circuit 30 is configured to determine an order (a.k.a. current generation order) for generating the low-frequency currents $I_{DC1}$-$I_{DCN}$ in the operation periods $OP_{X-1}$, $OP_X$, $OP_{X+1}$, and so on (step 202). Accordingly, the current modulation circuit 14 can generate the low-frequency currents $I_{DC1}$-$I_{DCN}$ in each of the operation periods $OP_{X-1}$, $OP_X$, $OP_{X+1}$, and so on according to the determined current generation order (step 204).

Those skilled in the art will recognize improvements and modifications to the preferred embodiments of the present disclosure. All such improvements and modifications are considered within the scope of the concepts disclosed herein and the claims that follow.

What is claimed is:

1. A multi-voltage generation circuit comprising:
    a current modulation circuit configured to generate a plurality of low-frequency currents;
    a plurality of voltage modulation circuits configured to share the current modulation circuit based on a time-division schedule and each comprising:
        a respective one of a plurality of voltage amplifiers configured to generate a respective one of a plurality of modulated initial voltages based on a respective one of a plurality of modulated target voltages; and
        a respective one of a plurality of offset capacitors each modulated to a respective one of a plurality of offset voltages by a respective one of the plurality of low-frequency currents such that the respective one of the plurality of offset voltages can raise the respective one of the plurality of modulated initial voltages to thereby generate a respective one of a plurality of modulated voltages; and
    a control circuit configured to:
        determine the time-division schedule comprising an order of a plurality of non-overlapping charge intervals for generating the plurality of low-frequency currents, respectively, in one or more operation periods; and
        cause the current modulation circuit to generate a respective one of the plurality of low-frequency currents in a respective one of the plurality of non-overlapping charge intervals in each of the one or more operation periods according to the determined order.

2. The multi-voltage generation circuit of claim 1, wherein the control circuit is further configured to determine the order of the plurality of non-overlapping charge intervals to minimize a relative change in any of the plurality of low-frequency currents between each adjacent pair of the plurality of non-overlapping charge intervals.

3. The multi-voltage generation circuit of claim 1, wherein the current modulation circuit comprises:
    a multi-level charge pump (MCP) configured to operate based on a plurality of duty cycles to generate a plurality of low-frequency voltages each as a function of a battery voltage; and
    a power inductor coupled between the MCP and a common node and configured to induce the plurality of low-frequency currents based on the plurality of low-frequency voltages, respectively;
    wherein the control circuit is further configured to determine the plurality of duty cycles in accordance with the determined order for generating the plurality of low-frequency currents to thereby cause the current modulation circuit to generate the plurality of low-frequency currents in each of the one or more operation periods.

4. The multi-voltage generation circuit of claim 3, wherein the control circuit is further configured to cause each of the plurality of offset capacitors to be charged to the respective one of the plurality of offset voltages during a respective one of the plurality of non-overlapping charge intervals.

5. The multi-voltage generation circuit of claim 4, wherein the control circuit is further configured to:
    determine a plurality of discharge intervals in each of the one or more operation periods each non-overlapping with the respective one of the plurality of charge intervals; and
    cause each of the plurality of offset capacitors to be discharged to maintain the respective one of the plurality of modulated voltages during a respective one of the plurality of discharge intervals.

6. The multi-voltage generation circuit of claim 5, wherein each of the plurality of voltage modulation circuits further comprises:
    a respective voltage output that outputs the respective one of the plurality of modulated voltages, wherein the respective one of the plurality of offset capacitors is coupled between a respective one of the respective one of the plurality of voltage amplifiers and the respective voltage output;
    a respective bypass switch coupled between the respective output of the respective one of the plurality of voltage amplifiers and a ground; and
    a respective on-off switch coupled between the power inductor and the respective voltage output.

7. The multi-voltage generation circuit of claim 6, wherein the control circuit is further configured to, for each of the plurality of voltage modulation circuits:
    close the respective on-off switch during the respective one of the plurality of non-overlapping charge intervals to provide a respective one of the plurality of low-frequency currents from the common node to the respective voltage output;
    close the respective bypass switch during the respective one of the plurality of non-overlapping charge intervals such that the respective one of the plurality of low-frequency currents can charge the respective one of the plurality of offset capacitors to the respective one of the plurality of offset voltages; and
    cause the respective one of the plurality of voltage amplifiers to source or sink a respective high-frequency current during the respective one of the plurality of non-overlapping charge intervals to thereby maintain the respective one of the plurality of modulated voltages.

8. The multi-voltage generation circuit of claim 7, wherein the control circuit is further configured to, for each of the plurality of voltage modulation circuits:

open the respective on-off switch during the respective one of the plurality of discharge intervals to block the respective one of the plurality of low-frequency currents from flowing from the common node to the respective voltage output; and open the respective bypass switch during the respective one of the plurality of discharge intervals such that the respective one of the plurality of offset capacitors is discharged to maintain the respective one of the plurality of modulated voltages.

9. The multi-voltage generation circuit of claim 7, wherein each of the plurality of voltage amplifiers is further configured to generate a respective one of a plurality of sense currents indicating a respective amount of the high-frequency current that is sourced/sunk by the respective one of the plurality of voltage amplifiers during the respective one of the plurality of non-overlapping charge intervals.

10. The multi-voltage generation circuit of claim 9, wherein the control circuit is further configured to determine each of the plurality of duty cycles based on one or more of:

the respective one of the plurality of modulated initial voltages;

the respective one of the plurality of offset voltages;

the respective one of the plurality of modulated voltages; and the respective one of the plurality of sense currents.

11. A method for generating multiple low-frequency currents comprising:

determining a time-division schedule comprising an order of a plurality of non-overlapping charge intervals for generating a plurality of low-frequency currents, respectively, in one or more operation periods;

generating a respective one of the plurality of low-frequency currents in a respective one of the plurality of non-overlapping charge intervals in each of the one or more operation periods according to the determined order in the time-division schedule;

generating a respective one of a plurality of modulated initial voltages based on a respective one of a plurality of modulated target voltages; and modulating a respective one of a plurality of offset voltages by a respective one of the plurality of low-frequency currents such that the respective one of the plurality of offset voltages can raise the respective one of the plurality of modulated initial voltages to thereby generate a respective one of a plurality of modulated voltages.

12. The method of claim 11, further comprising determining the order of the plurality of non-overlapping charge intervals to minimize a relative change in any of the plurality of low-frequency currents between each adjacent pair of the plurality of non-overlapping charge intervals.

13. The method of claim 11, further comprising:

operating based on a plurality of duty cycles to generate a plurality of low-frequency voltages each as a function of a battery voltage;

inducing the plurality of low-frequency currents based on the plurality of low-frequency voltages, respectively; and determining the plurality of duty cycles in accordance with the determined current generation in order to thereby generate the plurality of low-frequency currents in each of the one or more operation periods.

14. The method of claim 13, further comprising charging a plurality of offset capacitors in the plurality of non-overlapping charge intervals based on the plurality of low-frequency currents, respectively.

15. The method of claim 14, further comprising:

determining a plurality of discharge intervals in each of the one or more operation periods each non-overlapping with the respective one of the plurality of charge intervals; and discharging the plurality of offset capacitors in the plurality of discharge intervals, respectively.

16. A multi-voltage power management circuit comprising:

a plurality of power amplifier circuits configured to concurrently amplify a plurality of radio frequency (RF) signals based on a plurality of modulated voltages, respectively; and a multi-voltage generation circuit comprising:

a current modulation circuit configured to generate a plurality of low-frequency currents;

a plurality of voltage modulation circuits configured to share the current modulation circuit based on a time-division schedule and each comprising:

a respective one of a plurality of voltage amplifiers configured to generate a respective one of a plurality of modulated initial voltages based on a respective one of a plurality of modulated target voltages; and a respective one of a plurality of offset capacitors each modulated to a respective one of a plurality of offset voltages by a respective one of the plurality of low-frequency currents such that the respective one of the plurality of offset voltages can raise the respective one of the plurality of modulated initial voltages to thereby generate a respective one of the plurality of modulated voltages; and a control circuit configured to:

determine the time-division schedule comprising an order of a plurality of non-overlapping charge intervals for generating the plurality of low-frequency currents, respectively, in one or more operation periods; and cause the current modulation circuit to generate a respective one of the plurality of low-frequency currents in a respective one of the plurality of non-overlapping charge intervals in each of the one or more operation periods according to the determined order.

17. The multi-voltage power management circuit of claim 16, wherein the control circuit is further configured to determine the order of the plurality of non-overlapping charge intervals to minimize a relative change in any of the plurality of low-frequency currents between each adjacent pair of the plurality of non-overlapping charge intervals.

18. The multi-voltage power management circuit of claim 16, wherein the current modulation circuit comprises:

a multi-level charge pump (MCP) configured to operate based on a plurality of duty cycles to generate a plurality of low-frequency voltages each as a function of a battery voltage; and a power inductor coupled between the MCP and a common node and configured to induce the plurality of low-frequency currents based on the plurality of low-frequency voltages, respectively;

wherein the control circuit is further configured to determine the plurality of duty cycles in accordance with the determined order for generating the plurality of low-frequency currents to thereby cause the current modulation circuit to generate the plurality of low-frequency currents in each of the one or more operation periods.

19. The multi-voltage power management circuit of claim 18, wherein the control circuit is further configured to cause each of the plurality of offset capacitors to be charged to the respective one of the plurality of offset voltages during a respective one of the plurality of non-overlapping charge intervals.

20. The multi-voltage power management circuit of claim 19, wherein the control circuit is further configured to:

determine a plurality of discharge intervals in each of the one or more operation periods each non-overlapping with the respective one of the plurality of charge intervals; and cause each of the plurality of offset capacitors to be discharged to maintain the respective one of the plurality of modulated voltages during a respective one of the plurality of discharge intervals.

\* \* \* \* \*